US009466577B2

(12) United States Patent
Lin

(10) Patent No.: US 9,466,577 B2
(45) Date of Patent: Oct. 11, 2016

(54) SEMICONDUCTOR INTERCONNECT STRUCTURE WITH STACKED VIAS SEPARATED BY SIGNAL LINE AND METHOD THEREFOR

(75) Inventor: Yaojian Lin, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 897 days.

(21) Appl. No.: 12/035,843

(22) Filed: Feb. 22, 2008

(65) Prior Publication Data
US 2009/0212441 A1 Aug. 27, 2009

(51) Int. Cl.
*H01L 23/00* (2006.01)
(52) U.S. Cl.
CPC ............ *H01L 24/03* (2013.01); *H01L 24/05* (2013.01); *H01L 24/13* (2013.01); *H01L 2224/0401* (2013.01); *H01L 2224/05552* (2013.01); *H01L 2224/13022* (2013.01); *H01L 2924/014* (2013.01); *H01L 2924/0105* (2013.01); *H01L 2924/01013* (2013.01); *H01L 2924/01014* (2013.01); *H01L 2924/01022* (2013.01); *H01L 2924/01023* (2013.01); *H01L 2924/01024* (2013.01); *H01L 2924/01029* (2013.01); *H01L 2924/01033* (2013.01); *H01L 2924/01047* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/14* (2013.01); *H01L 2924/3011* (2013.01); *H01L 2924/30105* (2013.01)

(58) Field of Classification Search
CPC ........ H01L 24/03; H01L 24/05; H01L 24/13
USPC ................... 257/758, 774, 737–738, E23.02, 257/E23.021; 438/637, 638, 640
See application file for complete search history.

(56) References Cited

U.S. PATENT DOCUMENTS

| 7,566,650 B2 * | 7/2009 | Lin et al. ...................... 438/613 |
| 2005/0236709 A1 * | 10/2005 | Eng et al. ...................... 257/737 |
| 2006/0197191 A1 | 9/2006 | Tsai et al. |
| 2007/0023925 A1 | 2/2007 | Ke et al. |

* cited by examiner

*Primary Examiner* — Laura Menz
*Assistant Examiner* — Candice Y Chan
(74) *Attorney, Agent, or Firm* — Robert D. Atkins; Patent Law Group: Atkins and Associates, P.C.

(57) ABSTRACT

A semiconductor device is made by forming a first conductive layer over a substrate, forming a first passivation layer over the first conductive layer, forming a first via in the first passivation layer to expose the first conductive layer, forming a second conductive layer over the first passivation layer and within the first via to electrically connect to the first conductive layer, forming a second passivation layer over the second conductive layer, and forming a second via in the second passivation layer to expose the second conductive layer. The second via is smaller than the first via. The second via is either physically separate from or disposed over the first via. The second conductive layer within the second via has a flat surface which is wider than the second via. An under bump metallization is formed in the second via and electrically connected to the second conductive layer.

7 Claims, 4 Drawing Sheets

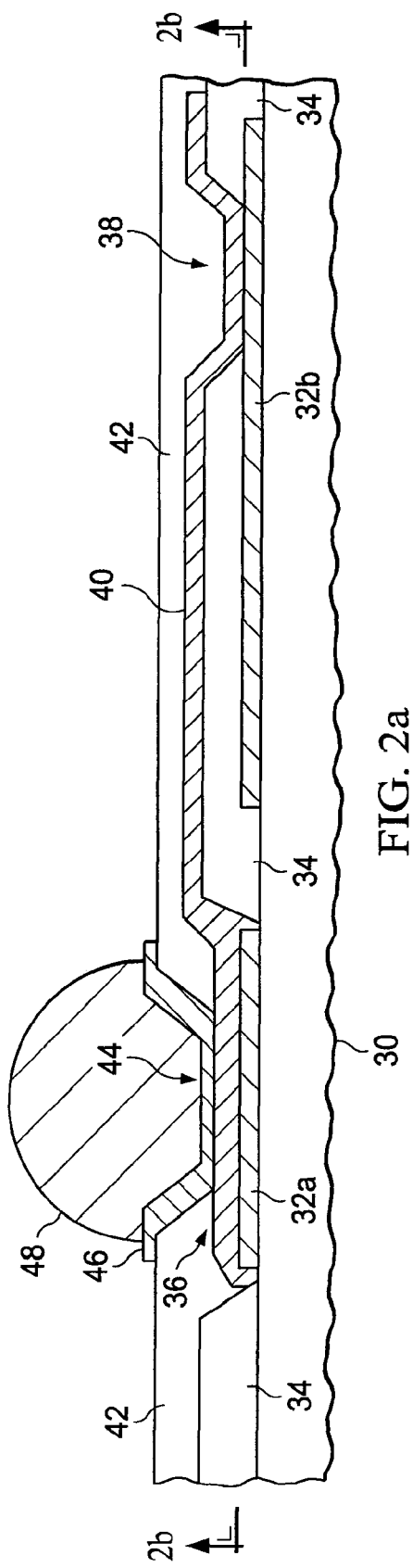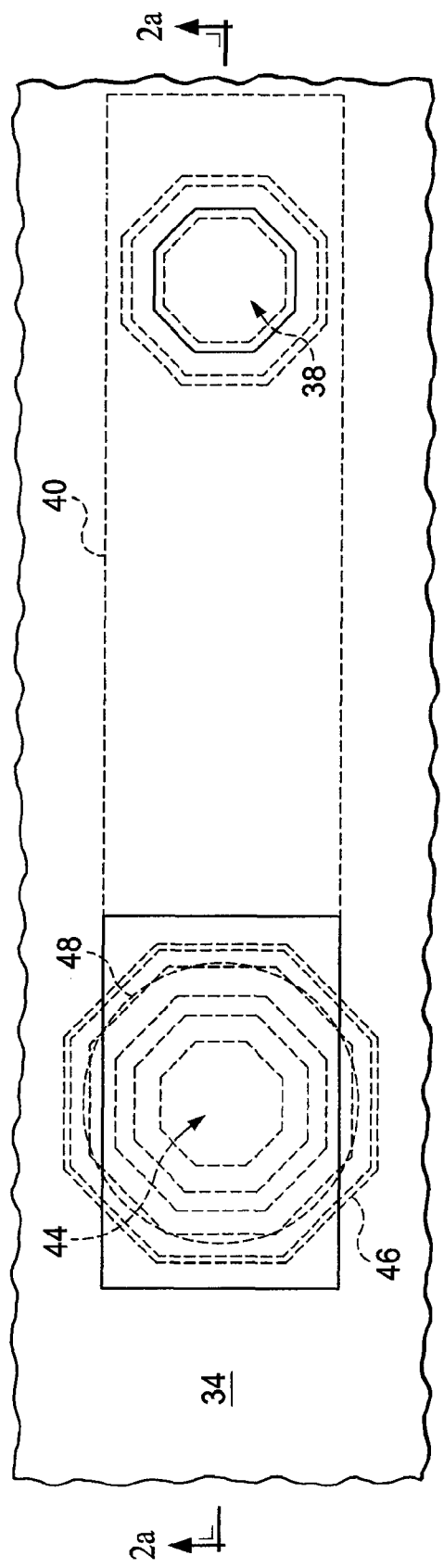
FIG. 2a
FIG. 2b

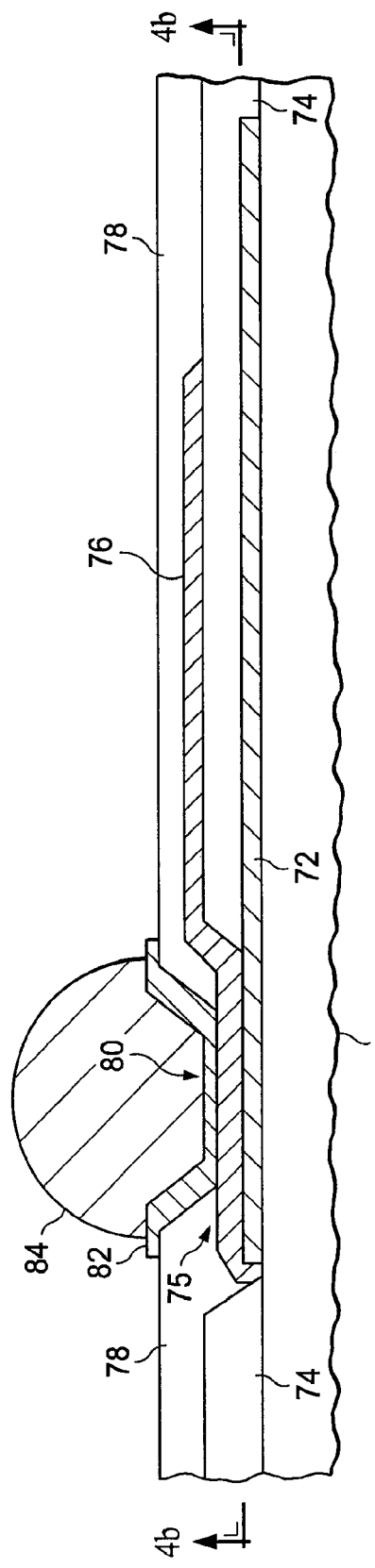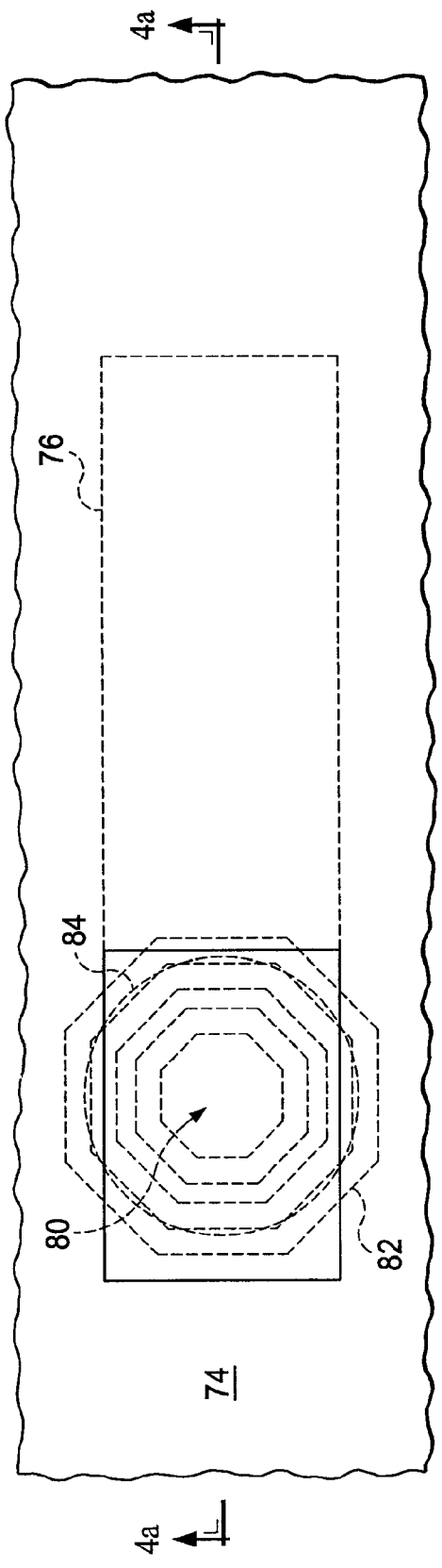

SEMICONDUCTOR INTERCONNECT STRUCTURE WITH STACKED VIAS SEPARATED BY SIGNAL LINE AND METHOD THEREFOR

FIELD OF THE INVENTION

The present invention relates in general to semiconductor devices and, more particularly, to a semiconductor interconnect structure with stacked vias separated by a signal line.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In some applications, the interconnect structure requires vias to be formed on different layers. The vias are typically 25-30 micrometers (μm) in width for flip-chip applications. After polyimide/benzocyclobutene (PI/BCB) patterning and curing, the lower via may be slightly larger, e.g., say about 32 μm, as compared to the upper via. The closely sized stacked vias require a high degree of alignment. Also, during the photolithographic exposure of the upper via, the ultraviolet light may strike the sidewall of metal inside the lower via, which may cause PI contamination as alignment shifts within tool tolerance. Accordingly, the relative openings of the vias can be restricted by topography and reduce manufacturing yield.

SUMMARY OF THE INVENTION

In one embodiment, the present invention is a method of making a semiconductor device comprising the steps of providing a substrate, forming a first conductive layer over the substrate, forming a first passivation layer over the first conductive layer, forming a first via in the first passivation layer to expose the first conductive layer, forming a second conductive layer over the first passivation layer and within the first via to electrically connect the second conductive layer to the first conductive layer, forming a second passivation layer over the second conductive layer, forming a second via in the second passivation layer to expose the second conductive layer. The second via is smaller than the first via. The second conductive layer within the second via has a flat surface which is wider than the second via. The method further includes the step of forming an under bump metallization in the second via which electrically connects to the second conductive layer.

In another embodiment, the present invention is a method of making a semiconductor device comprising the steps of providing a substrate, forming a first conductive layer over the substrate, forming a first passivation layer over the first conductive layer, forming a first via in the first passivation layer to expose the first conductive layer, forming a second conductive layer over the first passivation layer and within the first via to electrically connect the second conductive layer to the first conductive layer, forming a second passivation layer over the second conductive layer, and forming a second via in the second expose the second conductive layer.

In another embodiment, the present invention is a method of making a semiconductor device comprising the steps of providing a substrate, forming a conductive layer over the substrate, forming a passivation layer over the second conductive layer, and forming a via in the second passivation layer to expose the conductive layer. The conductive layer within the via has a flat surface which is wider than the second via.

In another embodiment, the present invention is a semiconductor device comprising a substrate and a first conductive layer formed over the substrate. A first passivation layer is formed over the first conductive layer. A first via is formed in the first passivation layer to expose the first conductive layer. A second conductive layer is formed over the first passivation layer and within the first via to electrically connect the second conductive layer to the first conductive layer. A second passivation layer is formed over the second conductive layer. A second via is formed in the second passivation layer to expose the second conductive layer.

BRIEF DESCRIPTION OF THE DRAWINGS

FIGS. 2a-2b illustrate top and cross-sectional views of a first embodiment of two stacked vias connected by a signal line;

FIGS. 4a-4b illustrate top and cross-sectional views of a third embodiment of two stacked vias connected by a signal line.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
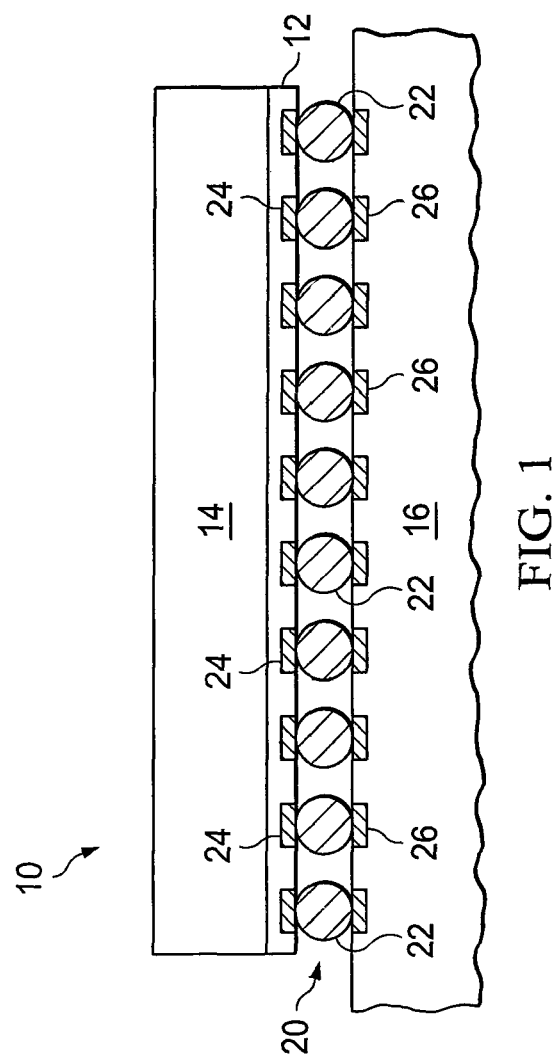
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2-4 illustrate various embodiments of a interconnect structure for use with flip chip or other semiconductor devices. FIG. 2a is a cross-sectional view of one exemplary formation of the interconnect structure. Semiconductor substrate 30 is made of silicon or other bulk semiconductor material. In one embodiment, semiconductor substrate 30 includes active devices and integrated passive devices (IPD), conductive layers, and dielectric layers according to the electrical design of the die. A metal layer 32 is formed on substrate 30. The metal layer 32 can be made with Al or Al alloy and an adhesion layer containing Ti/TiN. Alternatively, metal layer 32 can be made with Cu and an adhesion layer containing Ti, TiW, Cr, Ta/TaN, or TiN. The deposition of metal layer 32 uses an evaporation, sputtering, electrolytic plating, electroless plating, or screen printing process. The metal layer has a first portion 32a which is physically and electrically isolated from a second portion 32b. Metal layer portion 32a acts as a metal pad for providing better solder reliability in subsequent processing steps. Metal layer portion 32a is optional. Metal layer portion 32b operates as a ground plane with a connection to a low impedance ground point.

A passivation layer 34 is formed over semiconductor substrate 30 and metal layer 32 for structural support and physical isolation. Passivation layer 34 can be made with silicon nitride (SiN), silicon dioxide (SiO2), silicon oxynitride (SiON), polyimide (PI), benzocyclobutene (BCB), polybenzoxazole (PBO), epoxy-based photosensitive polymer, or other insulating material. A portion of passivation layer 34 is removed using an etching process to expose metal layers 32a and 32b. The removal of portions of passivation layer 34, as shown in FIG. 2a, defines vias 36 and 38. Via 36 is made about 30 micrometers (μm) in width, while via 38 is made about 25 μm in width. Consequently, via 36 is larger than via 38. Via 36 is also physically separated from via 38.

A conductive layer 40 is formed between metal layers 32a and 32b using a patterning and deposition process. Conductive layer 40 overlies and follows the contour of passivation layer 34. Conductive layer 40 is a signal line electrically connecting metal layers 32a and 32b. Conductive layer 40 can be made with aluminum (Al), Al alloy, copper (Cu), tin (Sn), nickel (Ni), gold (Au), silver (Ag), or combination of these materials with proper adhesion layer such as Ti, TiW, TiN, Ta/TaN, Cu, and other electrically conductive material. The deposition of conductive layer 40 uses an evaporation, sputtering, electrolytic plating, electroless plating, or screen printing process.

A passivation layer 42 is formed over conductive layer 40 and passivation layer 34 for structural support and physical isolation. Passivation layer 42 can be made with SiN, SiO2, SiON, PI, BCB, PBO, epoxy-based photosensitive polymer, or other insulating material. A portion of passivation layer 42 is removed using an etching process to expose conductive layer 40. The removal of portion of passivation layer 42, as shown in FIG. 2a, defines a third via 44 within via 36. Via 44 is made about 15 μm in width. Consequently, via 44 is smaller than vias 36 and 38. Via 44 is physically separated from via 38. Conductive layer 40 has a flat surface with sufficient width to encompass vias 38 and 44, see FIG. 2b.

A metal layer 46 is deposited over passivation layer 42 and conductive layer 40 by an evaporation, electrolytic plating, electroless plating, or screen printing process. Metal layer 46 is an under bump metallization (UBM) layer which follows the contour of passivation layer 42 and conductive layer 40. UBM 46 can be made with a stack of titanium (Ti), Ni, nickel vanadium (NiV), Cu, or Cu alloy.

An electrically conductive solder material is deposited over UBM 46 through an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi) and alloys thereof. For example, the solder material can be eutectic Sn/Pb, high lead, lead free, or other solder materials. The solder material is reflowed by heating the conductive material above its melting point to form spherical ball or bump 48. In some applications, solder bump 48 is reflowed a second time to improve electrical contact to UBM 46. Metal layer portion 32a acts as a metal pad for better solder reliability in forming solder bump 48. The semiconductor substrate 30 has a number of solder bumps like 48 which provide an interconnect structure for the semiconductor die according to its functional design. Solder bump 48 is electrically connected through UBM 46 and conductive layer 40 to ground plane 32b.

As a feature of the present invention, metal pad 32a is formed on a flat surface of substrate 30, within via 36 formed in passivation layer 34. Signal line 40 is then disposed on the metal pad 32a and UBM 46 is formed on signal line 40. Via 44 can be made smaller since it is disposed on the wide, flat surface of conductive layer 40, which in turn is disposed on flat surfaces of metal pad 32a and substrate 30. The flat foundation for the signal line/UBM stack enhances solder reliability as there is less potential for any solder void with the reduced topography. In addition, any polymer residue or contamination in via 44 due to misalignment in via stacking is substantially reduced or eliminated. With little or no polymer residue, the interconnection has less contact resistance which leads to better electric performance and yield.

Figure 3A:
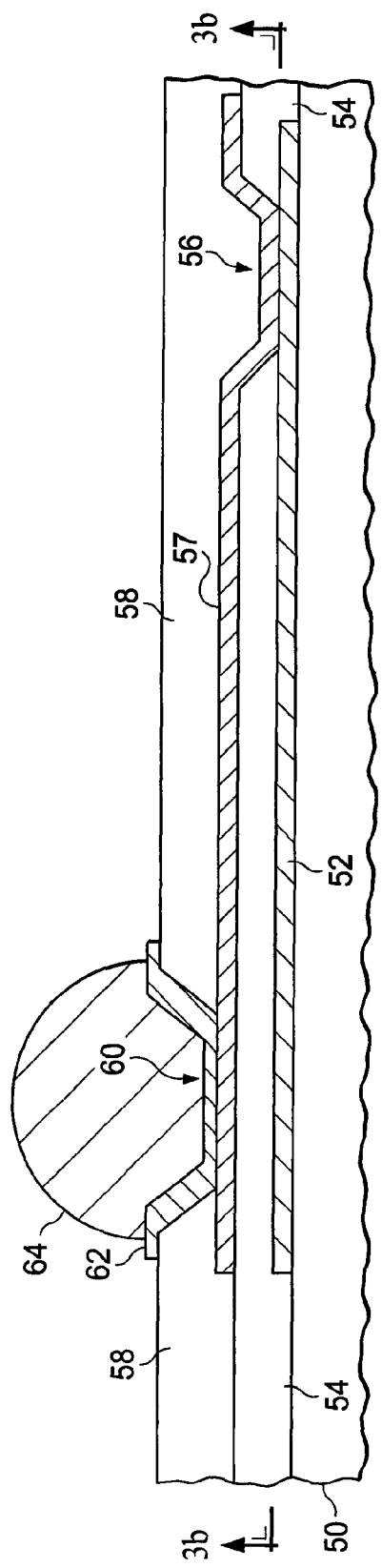
FIGS. 3a-3b illustrate top and cross-sectional views of a second embodiment of the two stacked vias connected by a signal line.
Figure 3B:
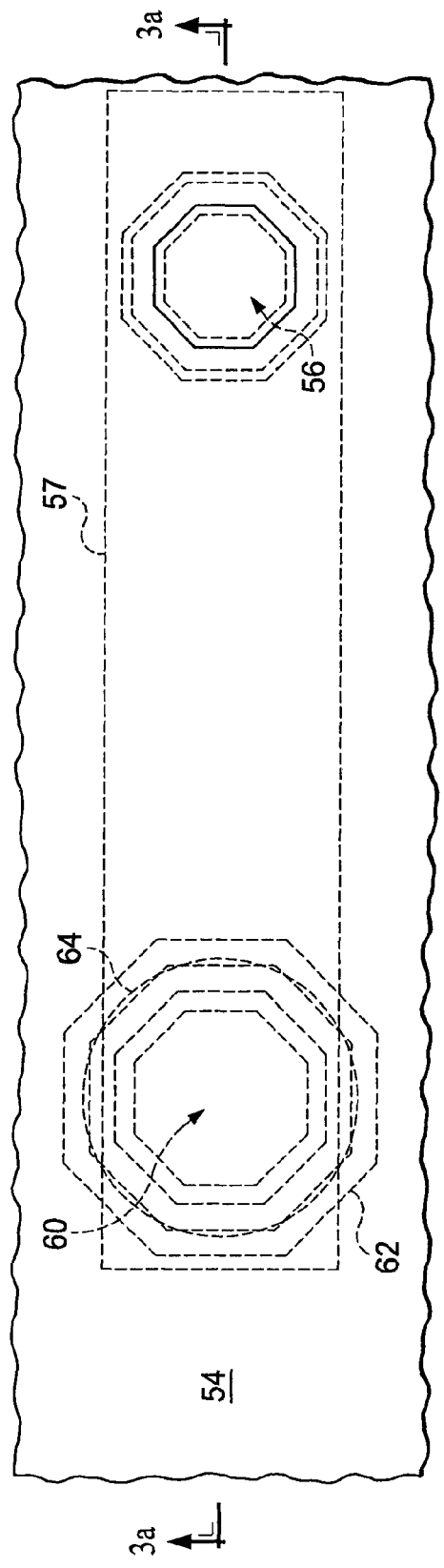

In FIG. 3a, semiconductor substrate 50 is made of silicon or other bulk semiconductor material. In one embodiment, semiconductor substrate 50 includes active devices and IPDs, conductive layers, and dielectric layers according to the electrical design of the die. A metal layer 52 is formed on substrate 50. The deposition of metal layer 52 uses an evaporation, sputtering, electrolytic plating, electroless plating, or screen printing process. Metal layer 52 operates as a ground plane with a connection to a low impedance ground point.

A passivation layer 54 is formed over semiconductor substrate 50 and metal layer 52 for structural support and physical isolation. Passivation layer 54 can be made with SiN, SiO2, SiON, PI, BCB, PBO, epoxy-based photosensitive polymer, or other insulating material. A portion of passivation layer 54 is removed using an etching process to expose metal layer 52. The removal of a portion of passivation layer 54, as shown in FIG. 3a, defines via 56. Via 56 can be in the range of 25 µm in width.

A conductive layer 57 is formed overlying passivation layer 54 using a patterning and deposition process. Conductive layer 57 follows the contour of passivation layer 54 and contacts metal layer 52 in via 56. Conductive layer 57 can be made with Al, Cu, Sn, Ni, Au, Ag, or combination of these materials with proper adhesion layer such as Ti, TiW, TiN, Ta/TaN, Cu, and other electrically conductive material. The deposition of conductive layer 57 can use an evaporation, electrolytic plating, electroless plating, or screen printing process.

A passivation layer 58 is formed over conductive layer 57 and passivation layer 54 for structural support and physical isolation. Passivation layer 58 can be made with SiN, SiO2, SiON, PI, BCB, PBO, epoxy-based photosensitive polymer, or other insulating material. A portion of passivation layer 58 is removed using an etching process to expose conductive layer 57. The removal of a portion of passivation layer 58, as shown in FIG. 3a, defines via 60, which is physically separate from via 56. Via 60 is made about 30 µm in width. Consequently, via 56 is smaller than via 60. The process allows for smaller via opening, in the range of 15 µm. Conductive layer 57 has a flat surface with sufficient width to encompass vias 56 and 60, see FIG. 3b.

A metal layer 62 is deposited over passivation layer 58 and conductive layer 57 by using an evaporation, electrolytic plating, electroless plating, or screen printing process. Metal layer 62 is a UBM layer which follows the contour of passivation layer 58 and conductive layer 57. UBM 62 can be made with a stack of Ti, Ni, NiV, Cu, or Cu alloy.

An electrically conductive solder material is deposited over UBM 62 using an evaporation, electrolytic plating, electroless plating, ball drop, or screen printing process. The solder material can be any metal or electrically conductive material, e.g., Sn, Pb, Ni, Au, Ag, Cu, Bi and alloys thereof. The solder material is reflowed by heating the conductive material above its melting point to form spherical ball or bump 64. In some applications, solder bump 64 is reflowed a second time to improve electrical contact to UBM 62. The semiconductor substrate 50 has a number of solder bumps like 64 which provide an interconnect structure for the semiconductor die according to its functional design. Conductive layer 57 operates as a signal line electrically connecting UBM 62 and metal layer 52. Thus, solder bump 64 is electrically connected through UBM 62 and conductive layer 57 to ground plane 52.

UBM 62 is formed in via 60 on the wide flat surface of conductive layer 57, as well as passivation layer 54. The flat foundation for the signal line/UBM stack enhances solder reliability as there is less potential for any solder void with the reduced topography. In addition, any polymer residue or contamination in via 60 due to misalignment in via stacking is substantially reduced or eliminated. With little or no polymer residue, the interconnection has less contact resistance which leads to better electric performance and yield.

In FIG. 4a, semiconductor substrate 70 is made of silicon or other bulk semiconductor material. In one embodiment, semiconductor substrate 70 includes active devices and IPDs, conductive layers, and dielectric layers according to the electrical design of the die. A metal layer 72 is formed on substrate 70. The deposition of metal layer 72 uses an evaporation, electrolytic plating, electroless plating, or screen printing process. Metal layer 72 operates as a ground plane with a connection to a low impedance ground point.

A passivation layer 74 is formed over semiconductor substrate 70 and metal layer 72 for structural support and physical isolation. Passivation layer 74 can be made with SiN, SiO2, SiON, PI, BCB, PBO, or other insulating material. A portion of passivation layer 74 is removed using an etching process to expose metal layer 72. The removal of a portion of passivation layer 74, as shown in FIG. 4a, defines via 75. Via 75 can be 10 µm wider than via 80.

A conductive layer 76 is formed overlying passivation layer 74 using a patterning and deposition process. Conductive layer 76 follows the contour of passivation layer 74 and contacts metal layer 72 in via 75. Conductive layer 76 can be made with Al, Cu, Sn, Ni, Au, Ag, or other electrically conductive material. The deposition of conductive layer 76 can use an evaporation, electrolytic plating, electroless plating, or screen printing process. Ground plane 72 extends under conductive layer 76.

A passivation layer 78 is formed over conductive layer 76 and passivation layer 74 for structural support and physical isolation. Passivation layer 78 can be made with SiN, SiO2, SiON, PI, BCB, PBO, or other insulating material. A portion of passivation layer 78 is removed using an etching process to expose conductive layer 76. The removal of a portion of passivation layer 78, as shown in FIG. 4a, defines via 80, which is physically separate from via 75. The width of via 80 depends on designed pitch, typical in the range of 20 to 100 µm. Consequently, via 80 is smaller than via 75. Via 80 is formed vertically over via 75. Conductive layer 76 has a flat surface with sufficient width to encompass vias 75 and 80, see FIG. 4b.

A metal layer 82 is deposited over passivation layer 78 and conductive layer 76 by using an evaporation, electrolytic plating, electroless plating, or screen printing process. Metal layer 82 is a UBM layer which follows the contour of passivation layer 78 and conductive layer 76. UBM 82 can be made with Ti, Ni, NiV, Cu, or Cu alloy. Conductive layer 76 functions as a contact pad for UBM 82.

An electrically conductive solder material is deposited over UBM 82 using an evaporation, electrolytic plating, electroless plating, ball drop, or screen printing process. The solder material can be any metal or electrically conductive material, e.g., Sn, Pb, Ni, Au, Ag, Cu, Bi and alloys thereof. The solder material is reflowed by heating the conductive material above its melting point to form spherical ball or bump 84. In some applications, solder bump 84 is reflowed a second time to improve electrical contact to UBM 82. The semiconductor substrate 70 has a number of solder bumps like 84 which provide an interconnect structure for the semiconductor die according to its functional design. Conductive layer 76 operates as a signal line electrically connecting UBM 82 and metal layer 72. Thus, solder bump 84 is electrically connected through UBM 82 and conductive layer 76 to ground plane 72.

UBM 82 is formed in via 80 on the wide flat surface of conductive layer 76, as well as metal layer 72 and substrate 70. The flat foundation for the signal line/UBM stack enhances solder reliability as there is less potential solder void with the reduced topography. In addition, any polymer residue or contamination in via 80 due to misalignment in via stacking is substantially reduced or eliminated. With little or no polymer residue, the interconnection has less contact resistance which leads to better electric performance and yield.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive layer over the substrate;
   forming a first insulating layer over the first conductive layer;
   forming a first via in the first insulating layer to expose the first conductive layer and including a maximum width and a minimum width that is different from the maximum width;
   forming a second conductive layer over the first insulating layer and within the first via to electrically connect the second conductive layer to the first conductive layer, the second conductive layer including an upper surface that follows a contour of the first via;
   forming a second insulating layer over the second conductive layer; and
   forming a second via in the second insulating layer and extending into the first via to expose a flat surface of the second conductive layer.

2. The method of claim 1, further including forming an under bump metallization in the second via and over the second insulating layer to electrically connect to the second conductive layer.

3. The method of claim 2, further including:
   depositing conductive material over the under bump metallization layer; and
   reflowing the conductive material to form a bump.

4. The method of claim 1, wherein the minimum width and maximum width of the first via have an average width of about 30 micrometers.

5. The method of claim 1, wherein the minimum width and maximum width of the second via have an average width of about 15 micrometers.

6. The method of claim 1, wherein the first conductive layer has first and second portions electrically connected by the second conductive layer.

7. The method of claim 1, further including forming a third via in the first insulating layer offset from the first via, the third via exposing the first conductive layer.

* * * * *